United States Patent
Tritt et al.

(10) Patent No.: US 7,871,668 B2
(45) Date of Patent: Jan. 18, 2011

(54) CONVECTIVE FLOW CHEMICAL VAPOR DEPOSITION GROWTH OF NANOSTRUCTURES

(75) Inventors: Terry M. Tritt, Anderson, SC (US); Bo Zhang, Clemson, SC (US); Jian He, Clemson, SC (US)

(73) Assignee: Clemson University Research Foundation, Clemson, SC (US)

( * ) Notice: Subject to any disclaimer, the term of this patent is extended or adjusted under 35 U.S.C. 154(b) by 170 days.

(21) Appl. No.: 12/066,310

(22) PCT Filed: Sep. 22, 2006

(86) PCT No.: PCT/US2006/037047

§ 371 (c)(1),
(2), (4) Date: Aug. 4, 2008

(87) PCT Pub. No.: WO2007/038307

PCT Pub. Date: Apr. 5, 2007

(65) Prior Publication Data

US 2009/0140211 A1    Jun. 4, 2009

Related U.S. Application Data

(60) Provisional application No. 60/720,091, filed on Sep. 23, 2005.

(51) Int. Cl.
*C23C 16/00* (2006.01)
*C23C 16/06* (2006.01)
*C23C 16/44* (2006.01)

(52) U.S. Cl. .................. 427/248.1; 427/58; 427/250; 427/255.23; 427/255.28; 427/508; 252/500; 252/518.1; 252/519.13; 252/519.14

(58) Field of Classification Search ......... 250/500–511, 250/518.1, 519.13, 519.14; 427/428.1–447.3, 427/58, 248.1, 250, 255.23, 255.28, 508
See application file for complete search history.

(56) References Cited

U.S. PATENT DOCUMENTS

| 5,943,471 A | * | 8/1999 | Atwell ..................... 392/386 |
| 6,254,933 B1 | * | 7/2001 | Habuka et al. ............ 427/248.1 |
| 6,552,255 B1 | | 4/2003 | Tritt et al. |

(Continued)

OTHER PUBLICATIONS

Teo et al. "Catalytic Synthesis of Carbon Nanotubes and Nanofibers" Encyclopedia of Nanoscience and Nanotechnology. vol. X, pp. 1-22, 2003.*

(Continued)

*Primary Examiner*—Mark Kopec
*Assistant Examiner*—Tri V Nguyen
(74) *Attorney, Agent, or Firm*—Dority & Manning, P.A.

(57) ABSTRACT

The invention is directed to CVD methods and systems that can be utilized to form nanostructures. Exceptionally high product yields can be attained. In addition, the products can be formed with predetermined particle sizes and morphologies and within a very narrow particle size distribution. The systems of the invention include a CVD reactor designed to support the establishment of a convective flow field within the reactor at the expected carrier gas flow rates. In particular, the convective flow field within the reactor can include one or more flow vortices. The disclosed invention can be particularly beneficial for forming improved thermoelectric materials with high values for the figure of merit (ZT).

14 Claims, 7 Drawing Sheets

U.S. PATENT DOCUMENTS

| | | | |
|---|---|---|---|
| 7,384,680 | B2 | 6/2008 | Bi et al. |
| 2005/0037204 | A1* | 2/2005 | Osiander et al. ............ 428/408 |
| 2005/0123467 | A1 | 6/2005 | Harutyunyan |
| 2006/0067871 | A1* | 3/2006 | Hart et al. ................ 423/447.3 |

OTHER PUBLICATIONS

Andrews et al. "Continuous production of aligned carbon nanotubes: a step closer to commercial realization" Chem Phys Let, vol. 303, pp. 467-474, Apr. 1999.*

Abramson et al., "Fabrication and Characterization of a Nanowire/Polymer-Based Nanocomposite for a Prototype Thermoelectric Device", Journal of Microelectromechanical Systems, vol. 13, No. 3, Jun. 2004.

Bhattacharya et al., Grain Structure Effects on the Lattice Thermal Conductivity of Ti-based half-Heusler alloys, Applied Physics Letters, vol. 81 (1), pp. 43-45 (2002).

Bhattacharya et al., Effect of Sb doping on the thermoelectric properties of Ti-based half-Heusler compounds, $TiNiSn_{1-x}Sb_x$ Applied Physics Letters, 77, 2476 (2000).

Luo, et al., "Theory and experiments of electromagnetic loss mechanism for microwave heating of powdered metals", Applied Physics Letters, vol. 84, No. 25, pp. 5076-5078 (2004).

Kim, et al., "Chemical Vapor Deposition of $Ga_2O_3$ Thin Films on Si Substrates", Bull. Korean Chem. Soc. 2002 vol. 23, No. 2, pp. 225-228.

Harman, et al., "Quantum Dot Superlattice Thermoelectric Materials and Devices", Science, 297, pp. 2229-2232 (2002).

Kim et al., "Phonon scattering cross section of polydispersed spherical nanoparticles", Journal of Applied Physics, 99, 084306 (2006).

Majumdar, "Thermoelectricity in Semiconductor Nanostructures" Science, vol. 303, Feb. 6, 2004, pp. 777-778.

Rowe, et al., "The effect of phonon-grain boundary scattering on the lattice thermal conductivity and thermoelectric conversion efficiency of heavily doped fine-grained, hotpressed silicon germanium alloy", Journal of Applied Physics, 52 (12), pp. 7421-7426 (1981).

Sharp et al., The Thermal Conductivity of Polycrystalline $Bi_{88}Sb_{12}$, Phys. Stat. Sol., (a) 185, No. 2, pp. 257-265 (2001).

Tanka et al., "Evaporation Temperature Dependence of Particle Size of Sb-Nanoparticles Grown by Absorption Process in the Flowing Gas Evaporation Method", Jpn. Journal of Applied Physics, vol. 41(2002) pp. L 11175-1177, Part 2, No. 10B, Oct. 15, 2002.

Tritt et al., "Effects of Various Grain Structures on the Thermal Conductivity of Ti-based Half-Heusler alloys", Symp. Proc. International Conference on Thermoelectrics (2001).

Venkatasubramanian et al., "Thin-film thermoelectric devices with high room-temperature figures of merit", Nature, vol. 413, pp. 597-602 (2001).

Venkatasubramanian, et al., "Low-temperature organometallic epitaxy and its application to superlattice structures in thermoelectrics", Applied Physics Letters 75, No. 8, pp. 1104-1106 (1999).

Wu, et al., "Block-by-Block Growth of Single Crystaline Si/SiGe Superlattice Nanowires", Nano Letters 2 (2), 83-86 (2002).

Zhang et al., "Size-selective high-yield growth of lead telluride (PbTe) nanocrystals using a chemical vapor deposition technique" Applied Physics Letters, 88, 043119 (2006).

Zhao, et al., "Bismuth telluride nanotubes and the effects on the thermoelectric properties of nanotube-containing nanocomposites" Applied Physics Letters 86,06211 (2005).

* cited by examiner

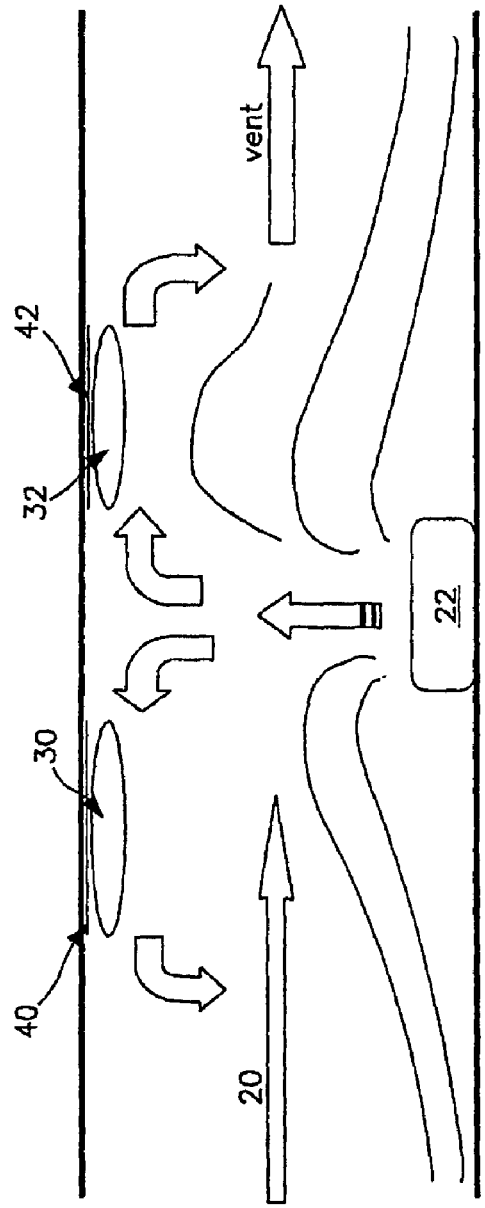
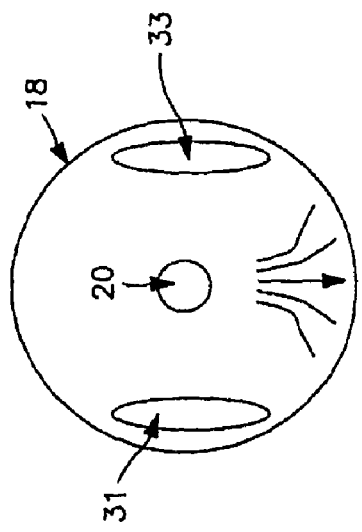
FIG. 2A
FIG. 2B

CONVECTIVE FLOW CHEMICAL VAPOR DEPOSITION GROWTH OF NANOSTRUCTURES

CROSS REFERENCE TO RELATED APPLICATION

This application claims benefit to U.S. Provisional Application Ser. No. 60/720,091 filed Sep. 23, 2005, and claims priority to PCT International Application No. PCT/US06/37047 filed Sep. 22, 2006.

BACKGROUND OF THE INVENTION

It has been demonstrated that the incorporation of nano-sized structures into macroscopically-sized products can improve product characteristics such as electrical characteristics, mechanical characteristics, thermal characteristics, and optical characteristics, just to name a few. However, the development of commercially available products that successfully incorporate nano-sized structures has often been stymied due to problems associated with formation of the nanostructures. For example, methods for forming bulk quantities of nanostructures have proven difficult to develop, especially when the costs associated with scale-up of existing laboratory-sized formation methods are considered. Moreover, methods for forming nanostructures in bulk such that the individual structures as formed exhibit little variation one to another in size and shape has also proven problematic.

Solid-state energy conversion, and in particular solid-state thermoelectric (TE) energy conversion, is just one exemplary technology area in which improved methods for forming high quality nanostructures in bulk could lead to improved product development. Thermoelectric solid-state energy conversion materials can be beneficially utilized in products to provide localized, compact energy conversion. These materials are becoming more common in a variety of applications, including cooling of electrical components (computer drives, laser diodes, etc.), localized climate control (vehicle seat warmers/coolers, food and beverage heaters/coolers, etc.), and in consumer products such as watches, lamps, and the like.

State of the art thermoelectric materials usually exhibit a dimensionless figure of merit (ZT) on the order of unity (ZT≈1). An enhancement of ZT by a factor of 2 or greater could provide improved thermoelectric materials for use in refrigeration, heating, and power generation applications. It has been predicted that nanoscaled thermoelectric materials might exhibit superior properties to those of their micro- or macroscaled counterparts. Following this prediction, a significant increase in ZT (i.e., ZT>2) was reported for nanoscaled systems constituently based on commonly used large scale TE materials (see, for example, R. Venkatasubramanian, et al., Nature, 413, 597 (2001), and T. C. Harman, et al., Science, 297, 2229 (2002)). In fact, it was known in the 1980s that the ZT for highly disordered alloys of PbTe with a mean grain size of 1 μm could be roughly 10% higher than the equivalent but single-crystal value.

Accordingly, one promising route to preparing thermoelectric materials with enhanced ZT may be to incorporate nanostructures formed of thermoelectric materials into a bulk phase matrix, in expectation that the phonon scattering at grain boundaries could significantly reduce the lattice thermal conductivity while the electrical properties could be largely preserved. However, in order to economically provide such enhanced thermoelectric materials, improved methods for forming the thermoelectric nanostructures is necessary. In particular, methods must be developed for forming such nanostructures economically in bulk. Moreover, such methods would ideally also provide the nanostructures with relatively little variance in size and with good crystalline nature.

Improved methods for forming nanostructures in bulk and within a narrow size distribution range can benefit other technologies as well, in addition to thermoelectrics. In fact, the ability to provide nanostructures in bulk and with a predetermined particle size can provide a new control parameter in formation of such composite materials that can be beneficially utilized to control and/or improve bulk characteristics such as strength characteristics, electrical characteristics, and the like for many different applications.

SUMMARY OF THE INVENTION

According to one embodiment, the present invention is directed to a method for forming nanostructures. The method can include, for instance, establishing a gas or vapor flow through a reactor. More specifically, the gas or vapor flow through the reactor can include a convective flow field that can include at least one vortex. Nanostructures can be formed in the reactor according to a chemical vapor deposition (CVD) method. The disclosed method can form nanostructures at a high weight percentage yield, for instance greater than about 5%.

Reactants can be provided to the process according to any suitable method, for instance in conjunction with the flow through the reactor or as a solid or liquid located at a suitable spot within the reactor.

In one embodiment, the convective flow field can include multiple vortices. For example, the convective flow field can include a second vortex. For instance, the first vortex can be upstream of a central portion of the reactor and the second vortex can be downstream of the central portion of the reactor. According to one such embodiment, a first portion of the nanostructures formed can deposit at a first surface adjacent the first vortex and a second portion of the nanostructures formed can deposit at a second surface adjacent the second vortex. In one particular embodiment, the nanostructures at the first surface and those at the second surface can differ from one another in size and/or shape.

In addition to forming nanostructures in high yield, the process can also form highly homogeneous nanostructures. For example, at least about 90% of the nanostructures formed in the process can define a size that is within about 10% of the average size of the nanostructures.

In another embodiment, the invention is directed to composites that can include the nanostructures. For instance, composites of the invention can include nanostructures held in a matrix. The nanostructures can include a semiconductor, for instance a Period 3 or higher elemental semiconductor, and the size distribution range of the nanostructures held in the matrix can be quite small. For example, the size distribution range of the nanostructures can have a standard deviation that is less than about 20% of the mean size of the nanostructures, or smaller yet in other embodiments, for instance less than 10% of the mean size of the nanostructures. In one particular embodiment the nanostructures can include a semi-metallic semiconductor. In another embodiment the nanostructures can be thermoelectric nanostructures.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which:

FIGS. 2A and 2B are schematic diagrams of an exemplary flow field that can be established during nanostructure formation processes as herein described, the flow field includes vortex areas as shown in the longitudinal cross section (2A) and lateral cross section (2B);

Figure 1:
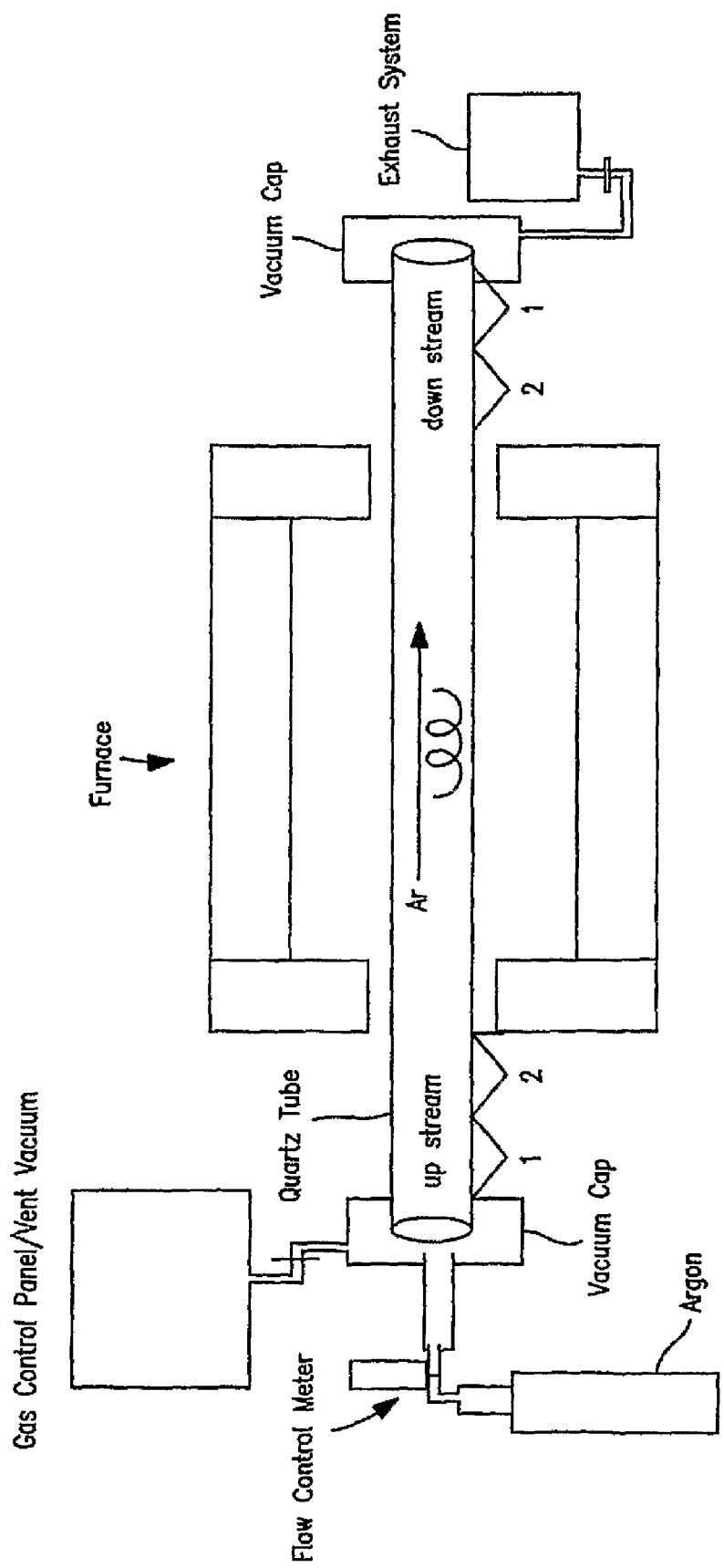
FIG. 1 is a schematic illustration of one embodiment of the system of the present invention.

Repeat use of reference characters in the present specification and drawings is intended to represent the same or analogous features or elements of the present invention.

DETAILED DESCRIPTION OF THE INVENTION

Reference will now be made in detail to various embodiments of the invention, one or more examples of which are set forth below. Each embodiment is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used in another embodiment to yield a still further embodiment.

In one embodiment, the presently disclosed invention is directed to chemical vapor deposition (CVD) methods and CVD systems for forming nanoparticles in bulk as well as to products that can beneficially incorporate the nanoparticles. For instance, through utilization of the disclosed CVD reactors and through recognition of the effects of controllable reaction parameters including reaction temperature and carrier gas flow rate, the disclosed methods can provide nanostructures in extremely high yields. Moreover, the product nanostructures can be obtained in high yields at predetermined particle size and/or shape and within a narrow particle size distribution range.

CVD techniques have long been used for growth and deposition of many materials, from deposition of thin films to growth of individual structures including nanostructures. Unfortunately, CVD methods, while providing high yield of product as compared to other methods, e.g., laser ablation methods, electric arc gas discharge methods, and vapor-liquid-solid (VLS) methods, yield is still too low to be practical for scale-up to industrial-type designs. For instance, when providing several grams of reactants to previously known CVD systems, products can be expected in the microgram range or possibly a few milligrams, with a weight percentage yield of 1 or 2% considered exceptional. (For purposes of the present disclosure, weight percentage yield is herein defined to refer to the total weight of product obtained/total weight of reactants×100%.)

Utilizing the CVD methods and systems of the present invention, much higher weight percentage yield can be obtained, for instance greater than about 5%, in some embodiments or higher yet, for instance greater than about 10%, greater than about 15%, or greater than about 20%, in various embodiments. For example, when providing several grams of reactants to the presently disclosed systems, the methods can provide several hundreds of milligrams of product. Moreover, the process can provide the products with good control of size distribution and micro-morphology. In addition, the presently disclosed systems can be easily and economically scaled-up to provide product in even greater quantities, e.g., product quantities measured in grams or even kilograms.

FIG. 1 schematically illustrates one exemplary system 10 of the present invention. As can be seen, the system can include many standard CVD elements, including flow controllers 12, carrier gas source 14, exhaust systems 16, vacuum caps 11, control panel 19, and the like. In addition, the system can include a reactor 18 designed to allow mass transit of reactants within the reactor 18, for instance via a carrier gas flow 20. The reactor 18 can be heated according to any suitable method, for instance by use of a furnace 23, as illustrated. However, in contrast with previously known CVD reactors, the reactor of the present invention has been specifically designed to include a geometry that can support establishment of a complex flow field within the reactor during a CVD process. In particular, the reactors of the presently disclosed systems can support the establishment of a convective flow field including one or more vortices during the CVD formation process.

In the embodiment illustrated in FIG. 1, the reactor 18 of the CVD system has a generally tubular geometry, and the cross-sectional dimension of the reactor 18 can support and encourage the establishment of a convective flow field within the reactor at the carrier gas flow rate expected during the formation process. For example, when considering carrier gas flow rates common to previously known CVD processes, e.g., greater than about 100 cc/min, the disclosed systems can incorporate tubular reactors that have a larger cross sectional diameter than those previously utilized, for instance greater than about one inch in diameter, so as to support the establishment of convective flow field including one or more vortices within the reactor during the formation process. For purposes of the present invention, the term 'convective flow field' is herein defined as a flow field that includes the circulation of currents between regions of the field. A convective flow field is thus differentiated from a laminar flow field, which does not include circulating currents of flow.

In another embodiment, a larger diameter tubular reactor can be utilized, for example, greater than about 2 inches in diameter, or greater yet, greater than about 3 inches in diameter. The preferred diameter of a tubular reactor for systems of the disclosed invention can generally depend upon the expected flow rate of the carrier gas through the reactor. In particular, a tubular reactor of the disclosed systems can define a large enough diameter such that, at the expected carrier gas flow rate through the reactor during the CVD formation process, a convective flow field including one or more vortices can be established within the reactor.

The reactor 18 can include one or more elements to encourage convective flow within the reactor during the CVD process. For instance, the reactor can include one or more structures that can interrupt or partially obstruct the carrier gas flow through the reactor and thus encourage the formation of a flow field in the reactor that includes one or more vortices. For example, the reactor interior can include formations such as plates, gates, baffles, posts, bars, mesh, or any other formation that can obstruct flow through the reactor somewhat and encourage the development of or otherwise support a convective flow field within the reactor during a CVD process. Moreover, such formations can be an integral portion of the reactor itself, e.g., an extension of an interior wall of the reactor, or optionally can be permanently placed or removable formations that can be placed within the reactor at predetermined locations and optionally removable or relocatable at a later time.

In yet another embodiment, the overall shape of the reactor itself can encourage the development of a convective flow field within the reactor during the CVD process. For example, the reactor can be of a basically tubular design, but can include bends, corners, or any other deviation in shape or design so as to encourage the establishment of a convective flow field within the reactor at the expected carrier gas flow rates. It should be understood, moreover, that no particular geometric configuration is required for the reactors of the presently disclosed systems. In particular, CVD reactors suitable for use in the disclosed processes can define a tubular, circular, rectangular, or any other interior geometry. In addition, reactors for use in the disclosed process can include single-stage reactors or multi-stage reactors describing multiple temperature and/or pressure zones, as desired.

The reactor interior can also include one or more product collection locations including surfaces suitable for deposition of the product nanostructures. For example, the reactor can include an interior wall surface that is conducive to product deposition, such as quartz for example, and product deposition can occur directly on the walls of the reactor. For instance, a portion of the interior wall can serve as a product collection location. Optionally, one or more removable substrates can be located within the reactor for product deposition. For example, a substrate can be coated (e.g., partially or completely covered) with catalyst or chemical reactants and/or formed from materials such as silicon, quartz, glassy carbon, graphite, pyrolytic boron nitride, alumina or the like such that product deposition can preferentially occur on the substrate. In general, materials for preferential product deposition can depend upon the particular chemistry and materials involved in the particular CVD process to be carried out. In those embodiments in which one or more substrates are located within the reactor for product deposition, the substrates can be placed at predetermined locations, described in more detail below, where high yield product deposition can preferentially take place during the CVD process.

Reactants and catalysts encompassed by the present invention can include any material that can be processed to form nanostructures via a CVD method. In particular, any reactant that can be provided to the system, vaporized at reaction conditions, converted to the desired product form, and/or deposited on a surface within the reactor (deposition generally occurring either subsequent to or concurrent with the conversion step) can be utilized in the disclosed systems. Optionally, the CVD methods of the invention can also include chemical reaction between reactants provided to the system. This is not a requirement of the present invention, however, and in other embodiments, the CVD process can physically convert the reactants to the desired product form, e.g., nanocrystals, nanorods, nanowires, nanoclusters, thin films, etc., with no chemical reaction necessarily taking place during the process.

In one embodiment, product nanostructures formed according to the disclosed methods can be semiconductive in nature and can include a Period 3 or higher elemental semiconductor. For example, product semiconductor nanostructures can include a semi-metallic semiconductive element (e.g., silicon, germanium, arsenic, tellurium, antimony, or astatine). In another embodiment, the present invention is directed to the formation of doped semiconductor nanostructures. For instance, the semiconductor nanostructures can include doped semiconductors including a period 3 or higher elemental semiconductor and in one particular embodiment a semi-metallic elemental semi-conductor. In one preferred embodiment, the process can be utilized in forming thin film or low dimensional structures of thermoelectric materials (e.g., Pb(Te/Se), $Bi_2Te_3$, Ti/Ni/Sn-based alloys, skutterudites, and the like).

According to the present process, reactants and catalysts can be provided to the reactor according to any suitable method. For example, as illustrated in FIG. 1, one or more reactants and catalysts can be provided to the reactor in the form of liquids or solids and located within the reactor prior to the commencement of the CVD process. For example, reactants can be located in the reactor in a boat as is generally known in the art.

A carrier gas flow describing a convective flow field can be established within the reactor. In general, the carrier gas flow can include an inert gas, such as argon. Optionally, one or more reactants can be provided to the reactor via the carrier gas flow. For example, gaseous reactants such as oxygen, nitrogen, or the like can be provided to the process via the carrier gas flow. In another embodiment, the carrier gas flow can provide vaporous reactants to the reactor, for instance volatile liquid hydrocarbons or aqueous materials can be provided to the reactor via the carrier gas flow. The gas/vapor reactants can decompose at the reaction conditions to provide one or more reactants to the CVD process.

FIG. 2A schematically illustrates one exemplary convective flow field that can be established according to the methods of the present invention. According to the illustrated embodiment, at reaction temperature and pressure the reactants and/or catalysts held in the boat 24 can vaporize and be taken up into the carrier gas flow 20. As can be seen with reference to the figure, a convective flow pattern within the reactor can lead to the development of flow vortices 30, 32 downstream and upstream of the boat, respectively. Accordingly, reactants can be carried both upstream and downstream and product development and deposition can be expected to occur both upstream and downstream of the boat, for instance at a portion of the reactor wall adjacent the vortices, such as product collection locations 40, 42, respectively. For purposes of the present disclosure, the term 'adjacent a vortex' is intended to refer to an area at or near to a vortex of the convective flow field. For instance, when considering a convective flow field such as that illustrated in FIG. 2A, including a single upstream vortex 32, a product collection point that is adjacent vortex 32 can be immediately adjacent the vortex, as at 42, or may be in the vicinity of vortex 32 without necessarily being immediately adjacent to vortex 32, such that the products formed from reactants caught in vortex 32 deposit at product collection point 42. In general, however, the product collection point of a vortex 32 that is upstream of the central portion of the reactor will likewise be upstream of the central portion of the reactor, though it may be at any location between the central portion of the reactor, e.g., where the boat 22 is located on FIG. 2, and the vent of the reactor.

As reactants can be 'caught' in the vortices and effectively held in the reactor for a longer time as compared to a reactor operating with a more laminar flow field, it is believed that the presently disclosed invention can prevent loss of reactant from the reactor in the vented carrier gas flow. This is believed to at least partially account for the dramatic increase in product yield possible in the presently disclosed systems.

While not wishing to be bound by any particular theory, it is believed that the development of the complex flow field within the reactor, and in particular the development of one or more flow vortices within the reactor, leads to both the improved yield and the improved correspondence between individual product nanostructures in both size and shape obtained with the presently disclosed process. In particular, the local environment in or near a flow vortex developed within the macroscopic reactor can be substantially constant, and the reactants can be held in this substantially constant environment throughout the CVD process. Moreover, in the case of multiple vortices formed within the reactor, the local environment of each vortex can differ slightly from one another, but can remain essentially constant within themselves. Accordingly, reactants can be circulated within a vortex and subjected to the substantially constant reaction conditions of the local environment of the vortex for a longer period of time, and hence form the product nanostructures, individual members of which can exhibit very little variation in size and morphology from one another due to the substantially constant reaction conditions.

Reactants that are pulled to a different vortex, for instance the upstream vortex 32 rather than the downstream vortex 30, can be subjected to slightly different reaction conditions, and therefore can form a product that can be deposited at a second product collection location 42 in the reactor and can differ from that found in the first product collection location 40 as to size and/or morphology, but again, product formed within a single local environment can exhibit little variation in physical characteristics. In particular, product nanostructures collected at a single product collection location can exhibit very little variance from one another in both size and shape. For example at least about 90% of the nanostructures collected at a single product collection location can exhibit the same basic shape (e.g., spherical, cubic, rod-shaped, etc.) and can exhibit less than about 20% variation in size from one to another. In other embodiments, the size distribution range can be even smaller, for example, at least about 90% of the product nanostructures can exhibit less than about 10% variation in size, or even less in other embodiments, for instance less than about 5% variation in size.

The effect of specific product collection location on the particle size distribution obtained for the product appears to be of secondary consideration as compared to the effects of reaction temperature and carrier gas flow rate. For example, variation in product collection location from immediately adjacent a vortex location, as shown in FIG. 2, to a more distant location, e.g., closer to the end of the reactor, appears to be of secondary consideration in regard to the narrow size range distribution obtained.

Depending upon the particular product application desired, the different products collected at various locations throughout the reactor may be close enough to each other in size and shape that they can be combined for a single application. In other embodiments, however, the different products collected at the different product collection sites within the reactor can be utilized in separate applications, so as to provide product nanostructures within a very small size distribution range.

While the illustrated embodiment of FIG. 2A includes a single upstream vortex 32 and a single downstream vortex 30, other embodiments of the invention can include multiple upstream and/or multiple downstream vortices. Vortices can also be formed at the sides of the flow field. For example, FIG. 2B illustrates a lateral cross-sectional schematic view of a convective flow field that can be established within a reactor 18. As can be seen, this exemplary flow field can include a first vortex 31 and second vortex 33 at either side of the central gas flow designation 20.

The local environments at which the majority of the CVD process is expected to occur, i.e., the local environments at which reactants can be held and circulated in a vortex, can be varied through variation of the macroscopic control parameters, and particularly through variation of reaction temperature and carrier gas flow rate, with secondary consideration given to particular product collection location, as mentioned above.

For example, when forming PbTe nanostructures, it has been found that at higher heating temperature and at higher carrier gas flow rate, product nanoparticles of a smaller size can primarily be formed, and these smaller particles can primarily deposit and be collected farther from a central portion of the reactor. The converse case has also been shown, i.e., at lower heating temperature and lower carrier gas flow rate, larger particles can be formed, and these larger particles will primarily deposit closer to a central portion of the reactor. For example, optimal growth of 100 nm PbTe nanoparticles has been achieved at a heating temperature of about 1050° C., argon flow rate of about 360 cc/min, and collection location close to the end of tube reactor. On the other hand, 600 nm PbTe particles are preferentially formed in a process utilizing a heating temperature of between about 940° C. and about 950° C., argon flow rate of about 200 cc/min, and a collection location close to a central portion of the reactor. In both cases, however, impressively narrow particle size distribution and high-yield of PbTe nanocrystals can be obtained, for instance and the particle size distributions are neither a normal distribution nor mono-dispersed. In addition, the final size of the developing particles can often be a competing characteristic for product development, hence the optimization of growth of particles of one specific size can simultaneously suppress the growth of particles of other sizes, further narrowing the product particle size distribution. For example, the standard deviation in mean particle size can be less than about 10% of the mean particle size, or even less in other embodiments, for instance less than about 5%.

The ability to prepare large quantities of highly similar nanostructures as herein described can be utilized to improve material characteristics in many applications. For example, through predetermination and control of particle size when forming thermoelectric nanostructures, macroscopic materials exhibiting high performance thermoelectric characteristics can be prepared. For instance, the disclosed materials can be advantageously utilized in refrigeration or heating applications, or energy conversion applications. In one particular embodiment, the disclosed thermoelectric materials can be beneficially utilized for heat dissipation, for example to convert waste heat, such as that generated by machines such as automobiles, electronic appliances (computers, household appliances, etc.), or the like, to electrical energy. Such applications can not only be utilized to reduce the waste heat generated by the particular application, heat that over time can damage the machinery itself, but can also improve the electrical energy efficiency of the machine, through conversion of the waste heat to electrical energy that can then be utilized for operation of the machine, e.g., the vehicle or the electrical appliance.

In other embodiments, large quantities of nanostructures having a very narrow particle size distribution can advantageously be incorporated into composite materials in order to provide improved control over mechanical characteristics, for instance better control of modulus, elasticity, and the like.

When considering composite materials for use in optical applications, the ability to better control the particle size distribution of the nanostructures to be incorporated in the composite materials can be utilized to better control diffraction, refraction, and/or reflection of the optical materials that incorporate the nanostructures.

Products incorporating the nanostructures as herein described can be formed according to any suitable formation process as is generally known to one of skill in the art. For example, and depending upon the particular materials of the nanostructures, a plurality of the nanostructures can be compression molded in combination with a suitable matrix material to form a product. For instance, a plurality of nanostructures can be molded under heat and pressure, optionally in conjunction with a matrix including a binding or adhesive material, to form a product. In other embodiments, a plurality of nanostructures can be combined with a polymeric matrix that can include a thermoset or thermoplastic polymers, as desired, to form a product. A non-limiting list of exemplary matrix materials can include, for example, thermoplastic resins, acrylic resins, polyester resins, butyral resins, polyamide resins, and polycarbonate resins; thermosetting resins such as benzocyclobutene resins, phenol resins, and melamine resins; and ultraviolet-curable resins such as epoxy resins. The matrix materials can be conductive or semiconductive material, for example, the matrix materials can include PbTe, Bi, $Bi_2Te_3$ and skutterudites, for example.

Composite products including the nanostructures can be formed according to any suitable product formation methods including, but not limited to, melt formation methods including extrusion, blow molding, injection molding, and the like; solution formation methods, such as solution casting methods; spinning methods, e.g. electrospinning from solution, or the like.

The thermoelectric materials disclosed herein can exhibit improved figures of merit. For instance, the disclosed materials can enable a reduction in the lattice thermal conductivity of a material by a factor of 2 or more. Accordingly, the disclosed thermoelectric materials can exhibit a figure or merit, ZT, greater than 1, or on the order of 1.4 to 2, in one embodiment.

The present invention may be better understood with reference to the following examples.

EXAMPLE 1

A single zone split hinge furnace (Lindberg Blue M HFT55322A) with a horizontal quartz tube≈2 inches in diameter tube was set up as schematically illustrated in FIG. 1. In a standard experimental procedure, ≈2.0 g of PbTe powder (99.5%, >50 μm, Alfa Aesar), mixed with 2% atomic ratio of gold (99.9%, 10 μm, Alfa Aesar), was loaded into a ceramic boat located in the quartz tube at the central portion of the reactor. Air was evacuated before a mild argon gas (research class) flow was fed through for at least 10 minutes. Given that bulk PbTe has a total vapor pressure of $p^{tot}=10$ Torr at its melting point $T_M=950°$ C., a number of heating temperatures in the vicinity of the melting point and at different argon flow rates were tried in multiple experimental runs. It was found that a preset argon flow rate of about 360 cc/min or less and a heating temperature between about 940° C. and about 1050° C. for 1-2 hours yielded good reproducible results. The product PbTe nanocrystals, in the form of grey dust, were found deposited on the inner wall of the quartz tube at locations commensurate with the convective flow established in the tube. These samples were weighed and approximately 300 to 500 mg of material in total was collected.

At such a high yield, the unbiased statistics of particle size distribution (PSD) and microscopic morphology is very important. Several portions of the as-grown nanoparticles were collected from different sampling positions on the inner wall of the quartz tube, and then were put in a row (on carbon tape) on an SEM sample holder. This amount was able to sufficiently cover a surface area of at least a few square millimeters. A copper tape was attached beside the carbon tape to serve as the standard for Energy Disperse X-ray spectroscopy (EDX) analysis. The microscopic morphology and corresponding composition were studied on a Hitachi SN-3600 Scanning microscope (SEM), equipped with a digital EDX detector. In order to ensure the unbiased statistics, at least 3 locations were randomly chosen on each sample, with SEM pictures taken in consecutive at scales of 30 μm, 5 μm/2 μm and 500 nm.

Figure 3A:
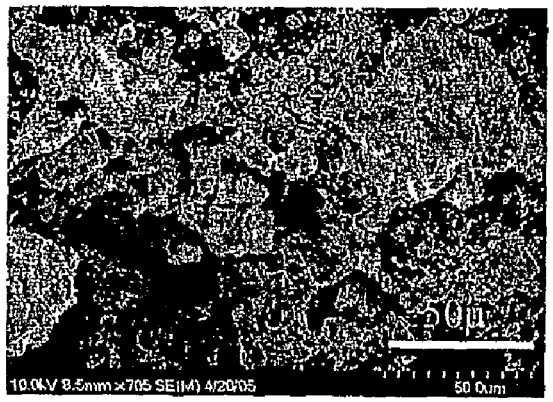
FIGS. 3A-3D are scanning electron micrographs (SEM) of raw lead telluride (PbTe) powder (3A) and PbTe nanocrystal products of various sizes (600 nm (3B), 200 nm (3C), and 100 nm (3D)) described in Example 1.
Figure 3B:
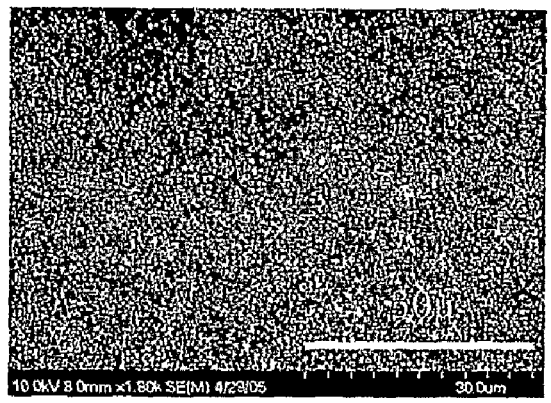
Figure 3C:
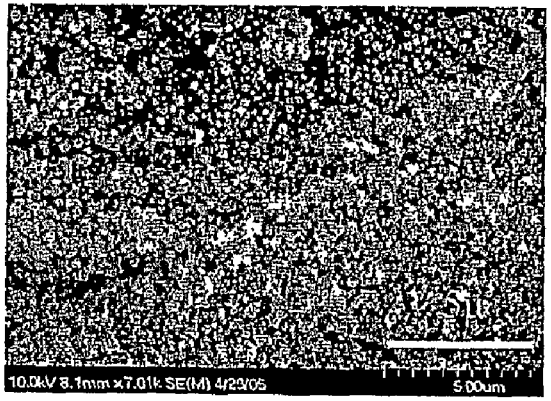
Figure 3D:
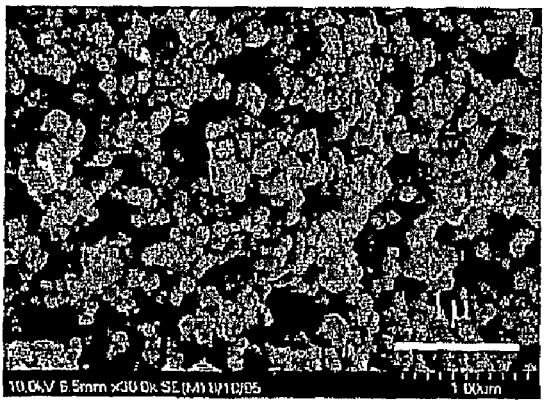
Figure 4A:
FIGS. 4A and 4B are SEMs comparing the morphology of the 600 nm nanocrystals of FIG. 3B (4A) and the 100 nm nanocrystals of FIG. 3D (4B)
Figure 4B:
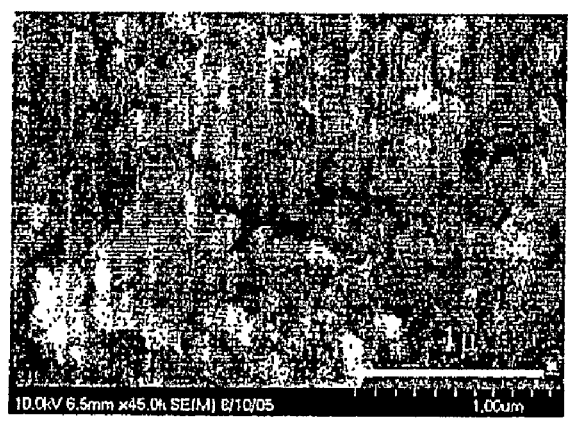

FIG. 3 illustrates representative SEM pictures of 3 samples having typical particle size of about 600 nm (FIG. 3B), 200 nm (FIG. 3C) and 100 nm (FIG. 3D), together with raw starting material (FIG. 3A). Both yield and narrow particle size distribution (PSD) are clearly evident. As can be seen in FIGS. 4A and 4B, the morphology of the as-grown particles with size of 600 nm and above (FIG. 4A) is essentially a perfect cubic shape, which is also an indication of very good crystallinity. Meanwhile, the smaller particles, shown in FIG. 4B, have a more irregular (round) shape, though X-ray powder diffraction also points toward an even better crystallinity, as further discussed below.

As suggested by SEM results, the nanoparticles of about 100 nm, 200 nm and 600 nm size were dominant in population within a wide range of growth conditions. In other words, the PSD is neither a normal distribution nor is it monodispersed. Moreover, the growth of these 3 different particles was found to be competing, so optimizing the growth of one specific size simultaneously suppressed the growth of the other two. In addition, PSD was also found dependent on the collection location (aggregation area), though this effect was found to be secondary to the temperature and flow rate growth controls.

The SEM and EDX measurements also found large amounts of 50 nm spherical gold particles formed close to the end of the tube during growth. The existence of the gold particles facilitates a more uniform particle size and the more gold particles found in one area, the smaller the typical particle size found in that area. However, the effect of the gold particles was found to be secondary to the effect of the heating temperature and argon flow rate.

Figure 5:
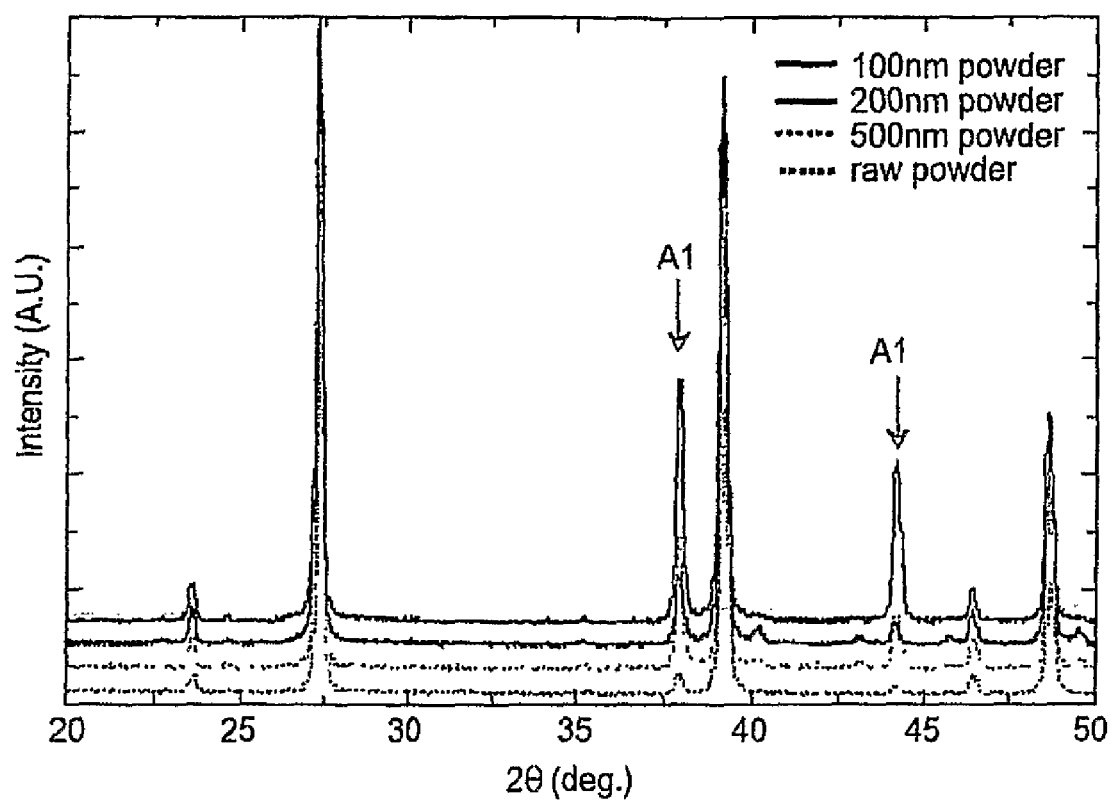
FIG. 5 illustrates X-ray diffraction data obtained for the samples illustrated in FIG. 3.

In addition to the SEM/EDX, further information regarding the chemical composition, crystal structure, crystallinity and particle size was obtained from X-ray powder diffraction (XRD) measurement. FIG. 5 presents the XRD patterns taken on the same samples presented in FIG. 3. As can be seen, all XRD patterns show sharp Bragg reflections, which indicate good crystallinity of samples. The patterns agree well with a cubic rock salt type (that of PbTe), and there is no impurity reflection observed. Further investigations on the (200) and (220) reflections, at $2\theta=27.572°$ and $39.410°$, respectively, show a small but systematic shift to the low angle with diminishing particle size as compared to that of raw powder. This shift corresponds to a lattice expansion from a=6.459 Å in bulk phase to a'=6.476 Å in 100 nm phase, a relative change of +0.26%. Another interesting phenomenon is the deviation from the Scherrer formula (as described in B. D. Cullity, Elements of X-ray Diffraction, 2nd edition, Addison-Wesley, Inc., 104, 1978) relating the broadening of peak width to the diminishing particle size. According to the Scherrer formula, one would expect to see a broadening of Full Width Half Maximum (FWHM) for all peaks due to the diminishing particle size. Irrespective of the type of fitting functions used (Pseudo-Voigt and Pearson functions), the FHHM of (200) and (220) reflections were found narrower than those of 500 nm and bulk phases. A plausible explanation is that 100 nm and 200 nm particles exhibit better crystallinity than 600 nm and raw powder.

EXAMPLE 2

Figure 6B:
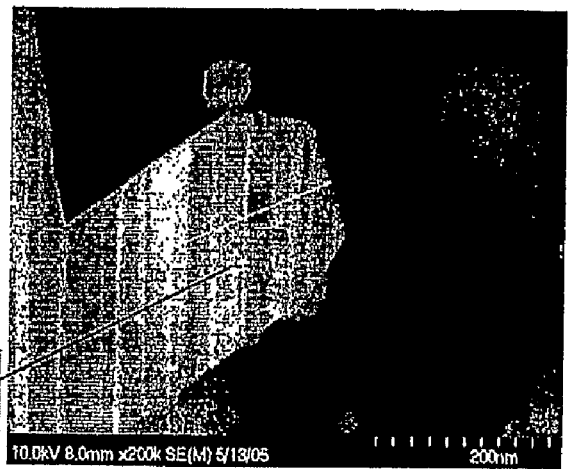
FIG. 6 is an SEM of bismuth telluride ($Bi_2Te_3$) nanorods formed according to one embodiment of the present invention.
Figure 6A:

A system such as that described above in Example 1 was utilized. Reactants loaded into the boat included the gold catalyst as described above and a few grams of n-type BiTe. Following evacuation of the quartz tube, argon flow rate was set to 90 cc/mm and the reaction temperature was set to about 725° C. FIGS. 6A and 6B are SEMs illustrating $Bi_2Te_3$ nanorods collected down stream of the boat. As can be seen, the nanorods described a hexagonal cross section, with the exemplary nanorod shown describing a cross-sectional diameter of approximately 106 nm.

Figure 7:
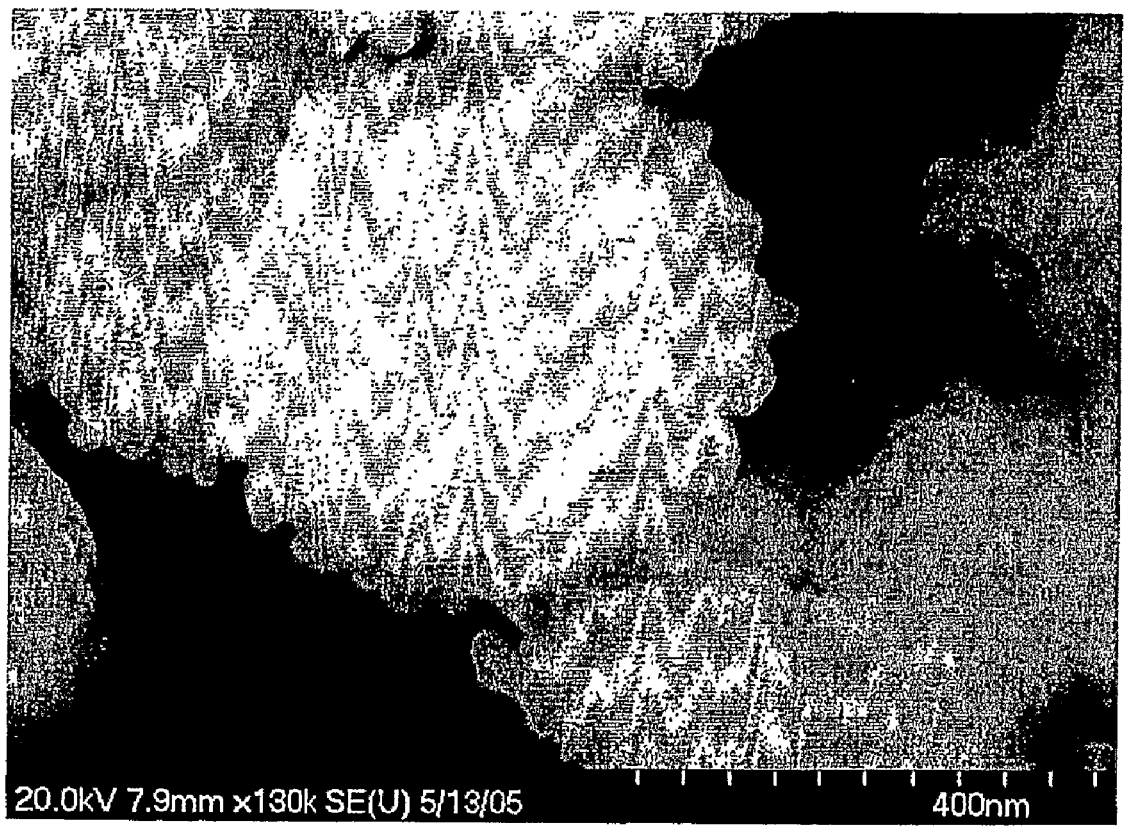
FIG. 7 is an SEM of Tellurium (Te) nanoclusters formed according to another embodiment of the present invention.

FIG. 7 illustrates the Te nanoclusters collected up stream of the boat in a similar system, but for a slightly lower reaction temperature. In the embodiment illustrated in FIG. 7, the reaction temperature was set to about 700° C. As can be seen, the control parameters of reaction temperature, argon flow rate, and flow field can have a strong effect on the morphology of the nanoparticles formed according to the present invention.

It will be appreciated that the foregoing examples, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention. Further, it is recognized that many embodiments may be conceived that do not achieve all of the advantages of some embodiments, yet the absence of a particular advantage shall not be construed to necessarily mean that such an embodiment is outside the scope of the present invention.

The invention claimed is:

1. A method for forming a thermoelectric nanostructures comprising:
    providing one or more solid reactants to a reactor;
    establishing a gas or vapor flow through the reactor wherein the flow through the reactor comprises a convective flow field that includes a first vortex and a second vortex, the first vortex and the second vortex circulating reactants at a local environment within the reactor; and
    forming the thermoelectric nanostructures in the reactor according to a chemical
    vapor deposition process, wherein the weight percentage yield of the
    thermoelectric nanostructures is greater than about 5%, wherein a first portion of the thermoelectric nanostructures are deposited at a first surface adjacent the first vortex and a second portion of the thermoelectric nanostructures are deposited at a second surface adjacent the second vortex and wherein the thermoelectric nanostructures deposited at the first surface and the thermoelectric nanostructures deposited at the second surface differ from one another by at least one of size and shape.

2. The method according to claim 1, further comprising providing a reactant to the reactor in the gas or vapor flow.

3. The method according to claim 1, further comprising providing a liquid reactant to the reactor.

4. The method according to claim 1, wherein the thermoelectric nanostructures comprise a semiconductor.

5. The method according to claim 1, wherein the first vortex is upstream of a central portion of the reactor and the second vortex is downstream of the central portion of the reactor.

6. The method according to claim 1, wherein at least about 90% of the thermoelectric nanostructures define a size that is within about 10% of the average size of the nanostructures.

7. The method according to claim 1, wherein the convective flow field includes additional vortices.

8. The method according to claim 1, wherein the thermoelectric nanostructures are nanocrystals.

9. The method according to claim 1, wherein the thermoelectric nanostructures comprise PbTe.

10. The method according to claim 1, wherein the thermoelectric nanostructures comprise $Bi_2Te_3$.

11. The method according to claim 1, further comprising providing the solid reactants in a boat within the reactor.

12. The method according to claim 1, wherein the reactor defines a cross sectional dimension and the gas or vapor flow through the reactor is at a flow rate, the convective flow field being established due to the flow rate in that cross sectional dimension.

13. The method according to claim 1, the reactor comprising elements to encourage the convective flow field including the first vortex and the second vortex within the reactor.

14. The method according to claim 1, the thermoelectric nanostructures comprising one or more of silicon, germanium, arsenic, tellurium, antimony, selenium, or astatine.

* * * * *

UNITED STATES PATENT AND TRADEMARK OFFICE
CERTIFICATE OF CORRECTION

PATENT NO. : 7,871,668 B2
APPLICATION NO. : 12/066310
DATED : January 18, 2011
INVENTOR(S) : Terry M. Tritt et al.

Page 1 of 1

It is certified that error appears in the above-identified patent and that said Letters Patent is hereby corrected as shown below:

In the Specifications:

Column 1, line 12 (insert prior to FIELD OF INVENTION) --This invention was made with government support under grant number CD-FG02-04ER-46139 awarded by the Department of Education. The government has certain rights in the invention.--

Signed and Sealed this
Twenty-third Day of April, 2013

Teresa Stanek Rea
*Acting Director of the United States Patent and Trademark Office*